(12) United States Patent
Takai et al.

(10) Patent No.: US 10,862,455 B2
(45) Date of Patent: Dec. 8, 2020

(54) ELASTIC WAVE DEVICE (71) Applicant: Murata Manufacturing Co., Ltd., Nagaokakyo (JP)

(72) Inventors: Tsutomu Takai, Nagaokakyo (JP); Atsushi Tanaka, Nagaokakyo (JP); Seiji Kai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 553 days.

(21) Appl. No.: 15/834,206

(22) Filed: Dec. 7, 2017

(65) Prior Publication Data
US 2018/0102761 A1   Apr. 12, 2018

Related U.S. Application Data (63) Continuation of application No. PCT/JP2016/067749, filed on Jun. 15, 2016.

(30) Foreign Application Priority Data

Jul. 17, 2015 (JP) .................. 2015-142974

(51) Int. Cl.
*H03H 9/02* (2006.01)
*H03H 9/25* (2006.01)
(Continued)

(52) U.S. Cl.
CPC .......... *H03H 9/25* (2013.01); *H03H 9/02559* (2013.01); *H03H 9/02574* (2013.01);
(Continued)

(58) Field of Classification Search
CPC .......... H03H 9/02559; H03H 9/02574; H03H 9/0595
(Continued)

(56) References Cited

U.S. PATENT DOCUMENTS

2013/0285768 A1   10/2013   Watanabe et al.
2014/0225684 A1*  8/2014    Kando ............... H03H 9/14594
                                                333/195
(Continued)

FOREIGN PATENT DOCUMENTS

JP   2004-186938 A   7/2004
JP   2015-073331 A   4/2015
(Continued)

OTHER PUBLICATIONS

Official Communication issued in International Patent Application No. PCT/JP2016/067749, dated Sep. 6, 2016.

*Primary Examiner* — Derek J Rosenau
(74) *Attorney, Agent, or Firm* — Keating & Bennett, LLP (57) ABSTRACT

An elastic wave device includes a piezoelectric thin film provided on a low acoustic velocity film and an IDT electrode provided on the piezoelectric thin film, wherein the piezoelectric thin film is made of a piezoelectric single crystal and includes a first principal surface that is a positive surface in a polarization axis direction and a second principal surface that is a negative surface in the polarization axis direction. The first principal surface of the piezoelectric thin film faces the low acoustic velocity film, and the second principal surface faces the IDT electrode.

18 Claims, 10 Drawing Sheets

(51) Int. Cl.
    *H03H 9/05*          (2006.01)
    *H03H 9/145*        (2006.01)
    *H01L 41/047*      (2006.01)
    *H03H 9/64*         (2006.01)

(52) U.S. Cl.
    CPC ...... *H03H 9/0595* (2013.01); *H03H 9/14544* (2013.01); *H01L 41/0477* (2013.01); *H03H 9/6483* (2013.01)

(58) Field of Classification Search
    USPC ...... 310/313 R, 313 A, 313 B, 313 C, 313 D
    See application file for complete search history.

(56) References Cited

U.S. PATENT DOCUMENTS

| | | |
|---|---|---|
| 2016/0133823 A1 | 5/2016 | Tai et al. |
| 2016/0294354 A1* | 10/2016 | Saijo .................... H03H 9/1014 |
| 2016/0380611 A1* | 12/2016 | Kai .................... H03H 9/02992 |
| | | 310/313 B |

FOREIGN PATENT DOCUMENTS

| | | |
|---|---|---|
| JP | 2015-122566 A | 7/2015 |
| WO | 2012/086639 A1 | 6/2012 |
| WO | 2015/012005 A1 | 1/2015 |

\* cited by examiner

ELASTIC WAVE DEVICE

CROSS REFERENCE TO RELATED APPLICATIONS

This application claims the benefit of priority to Japanese Patent Application No. 2015-142974 filed on Jul. 17, 2015 and is a Continuation Application of PCT Application No. PCT/JP2016/067749 filed on Jun. 15, 2016. The entire contents of each application are hereby incorporated herein by reference.

BACKGROUND OF THE INVENTION

1. Field of the Invention

The present invention relates to an elastic wave device with a multilayer structure that includes a high acoustic velocity member, a low acoustic velocity film, and a piezoelectric thin film.

2. Description of the Related Art

In an elastic wave device according to WO2012/086639, a low acoustic velocity film and a piezoelectric thin film are stacked on a high acoustic velocity member. An IDT electrode is disposed on the piezoelectric thin film. The acoustic velocity of a bulk wave that propagates through the high acoustic velocity member is set to be higher than the acoustic velocity of an elastic wave in the main mode that propagates through the piezoelectric thin film. In addition, the acoustic velocity of a bulk wave that propagates through the low acoustic velocity film is set to be lower than the acoustic velocity of an elastic wave in the main mode that propagates through the piezoelectric thin film.

As described in WO2012/086639, in the elastic wave device having a structure in which a piezoelectric thin film, a low acoustic velocity film, and a high acoustic velocity member are stacked, variations frequently occur in the degree of close contact between the piezoelectric thin film and the low acoustic velocity film. For example, when the wavelength that is determined in accordance with the electrode finger pitch of the IDT electrode is assumed to be $\lambda$ and a piezoelectric thin film having a small thickness of $3.5\lambda$ or less is used, variations in the degree of close contact between the piezoelectric thin film and the low acoustic velocity film increases. Consequently, variations may occur in the characteristics, e.g., the temperature coefficient of resonant frequency TCF.

SUMMARY OF THE INVENTION

Preferred embodiments of the present invention provide elastic wave devices having characteristics with reduced variations, wherein the elastic wave devices have a structure in which a piezoelectric thin film having a small thickness, a low acoustic velocity film, and a high acoustic velocity member are stacked.

A preferred embodiment of the present invention provides an elastic wave device including a piezoelectric thin film, a high acoustic velocity member, through which a bulk wave propagates at an acoustic velocity higher than the acoustic velocity of an elastic wave in the main mode that propagates through the piezoelectric thin film, a low acoustic velocity film which is stacked on the high acoustic velocity member and through which a bulk wave propagates at an acoustic velocity lower than the acoustic velocity of an elastic wave in the main mode that propagates through the piezoelectric thin film, the piezoelectric thin film being disposed on the low acoustic velocity film, and an IDT electrode being disposed on the piezoelectric thin film, wherein the piezoelectric thin film is made of a piezoelectric single crystal, a principal surface facing the low acoustic velocity film is a positive surface in a polarization axis direction, and a principal surface facing the IDT electrode is a negative surface in the polarization axis direction.

In a preferred embodiment of an elastic wave device according to the present invention, when a wavelength that is determined in accordance with the electrode finger pitch of the IDT electrode is assumed to be $\lambda$, a thickness of the piezoelectric thin film is about $3.5\lambda$ or less. With this configuration, a Q value is able to be increased. Preferably, the thickness of the piezoelectric thin film is about $2.5\lambda$ or less. With this configuration, the absolute value of TCF is able to be decreased. Further preferably, the thickness of the piezoelectric thin film is about $1.5\lambda$ or less. With this configuration, the acoustic velocity is able to be easily controlled.

In a preferred embodiment of an elastic wave device according to the present invention, the low acoustic velocity film is made of an oxide other than the piezoelectric single crystal.

In another preferred embodiment of an elastic wave device according to the present invention, the oxide is an inorganic oxide.

Preferably, the inorganic oxide is one material selected from the group consisting of silicon oxide, silicon oxynitride, tantalum oxide, and a compound produced by adding fluorine, carbon, or boron to silicon oxide. With this configuration, the absolute value of the temperature coefficient of resonant frequency TCF is able to be decreased.

In another preferred embodiment of an elastic wave device according to the present invention, the piezoelectric single crystal is $LiNbO_3$ or $LiTaO_3$, and the low acoustic velocity film contains Li. With this configuration, the close contact property between the low acoustic velocity film and the piezoelectric thin film is able to be more effectively improved.

In another preferred embodiment of an elastic wave device according to the present invention, the high acoustic velocity member is a high acoustic velocity support substrate.

In another preferred embodiment of an elastic wave device according to the present invention, a support substrate is further included, the high acoustic velocity member is a high acoustic velocity film, and the high acoustic velocity film is stacked between the support substrate and the low acoustic velocity film.

In another preferred embodiment of an elastic wave device according to the present invention, the low acoustic velocity film includes a first low acoustic velocity layer and a second low acoustic velocity layer, and the first low acoustic velocity layer and the second low acoustic velocity layer are bonded to each other with a first adhesive layer interposed therebetween. With this configuration, a multilayer portion facing one surface of the first adhesive layer and a multilayer portion facing the other surface may be produced and, thereafter, be bonded with the first adhesive layer interposed therebetween.

In another preferred embodiment of an elastic wave device according to the present invention, a second low acoustic velocity film stacked between the high acoustic velocity film and the support substrate is further included.

With this configuration, the influence of a bulk wave is able to be more effectively reduced.

In another preferred embodiment of an elastic wave device according to the present invention, the second low acoustic velocity film includes a third low acoustic velocity layer and a fourth low acoustic velocity layer, and the third low acoustic velocity layer and the fourth low acoustic velocity layer are bonded to each other with a second adhesive layer interposed therebetween. With this configuration, a multilayer portion facing one surface of the second adhesive layer and a multilayer portion facing the other surface may be bonded with the second adhesive layer interposed therebetween.

In another preferred embodiment of an elastic wave device according to the present invention, a third low acoustic velocity film is disposed on a second principal surface of the piezoelectric thin film, and the IDT electrode is disposed on the second low acoustic velocity film. With this configuration, an unnecessary bulk wave is able to be leaked to the third low acoustic velocity film.

In elastic wave devices according to preferred embodiments of the present invention, close contact between the piezoelectric thin film and the low acoustic velocity film is able to be improved, and variations in the electrical characteristics, e.g., temperature characteristics and filter characteristics, are able to be reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments according to the present invention will be described below with reference to the drawings so as to clarify the present invention.

In this regard, it is indicated that each of the preferred embodiments described in the present specification is an exemplification and the configuration may be partially replaced or combined with the configuration of another preferred embodiment.

Figure 1:
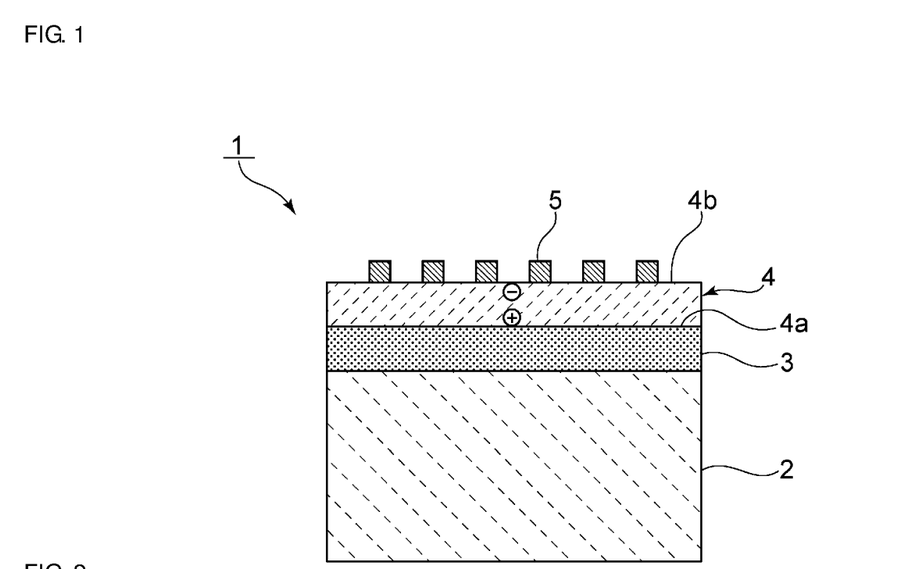
FIG. 1 is a sectional front view showing an elastic wave device according to a first preferred embodiment of the present invention.

FIG. 1 is a sectional front view showing an elastic wave device according to a first preferred embodiment of the present invention.

An elastic wave device 1 includes a support substrate 2 and a low acoustic velocity film 3 stacked on the support substrate 2. A piezoelectric thin film 4 is stacked on the low acoustic velocity film 3. The piezoelectric thin film 4 includes a first principal surface 4a and a second principal surface 4b. The piezoelectric thin film 4 is stacked on the low acoustic velocity film 3 such that the first principal surface 4a comes into contact with the low acoustic velocity film 3. An IDT electrode 5 is directly disposed on the second principal surface 4b of the piezoelectric thin film 4.

The support substrate 2 is preferably made of an appropriate rigid material. Examples of such a material include a piezoelectric, a dielectric, a semiconductor, and a synthetic resin. Examples of the piezoelectric include sapphire, lithium tantalate, lithium niobate, and quartz. Examples of the dielectric include ceramic, e.g., alumina, magnesia, silicon nitride, aluminum nitride, silicon carbide, zirconia, cordierite, mullite, and forsterite, and glass. Examples of the semiconductor include silicon and potassium nitride.

Preferably, a high acoustic velocity support substrate is used as the support substrate 2. The high acoustic velocity support substrate is preferably made of a material, through which a bulk wave propagates at an acoustic velocity higher than the acoustic velocity of an elastic wave in the main mode that propagates through the piezoelectric thin film 4. Here, the elastic wave in the main mode refers to an elastic wave in a mode that is used in the elastic wave device 1, and the mode is not limited to the basic mode. For example, aluminum nitride, aluminum oxide, silicon carbide, silicon oxynitride, silicon nitride, DLC, and diamond are suitable for use as such a material. In the present preferred embodiment, dielectrics, for example, piezoelectrics, e.g., sapphire, lithium tantalate, lithium niobate, and quartz, various types of ceramic, e.g., alumina, magnesia, silicon nitride, aluminum nitride, silicon carbide, zirconia, cordierite, mullite, steatite, and forsterite, and glass, semiconductors, e.g., silicon and gallium nitride, resin substrates, and other suitable materials, which are materials for forming the high acoustic velocity support substrate, are preferably used as the support substrate 2.

The low acoustic velocity film 3 is preferably made of a material, through which a bulk wave propagates at an acoustic velocity lower than the acoustic velocity of an elastic wave in the main mode that propagates through the piezoelectric thin film 4. An oxide other than the piezoelectric single crystal defining the piezoelectric thin film 4 is suitable for use as such a material. However, the material is not limited to the oxide as long as the above-described acoustic velocity relationship is satisfied.

The above-described oxide may be an inorganic oxide or an organic oxide. In this regard, the inorganic oxide is preferable because the mechanical strength is able to be increased and variations in the characteristics are able to be further reduced. Examples of the inorganic oxide include silicon oxide, silicon oxynitride, tantalum oxide, and a compound produced by adding fluorine, carbon, or boron to silicon oxide. In the present preferred embodiment, the low acoustic velocity film 3 is preferably made of silicon oxide.

The piezoelectric thin film 4 is preferably made of a piezoelectric single crystal. There is no particular limitation regarding the piezoelectric single crystal used, and preferably, lithium tantalate ($LiTaO_3$) or lithium niobate ($LiNbO_3$) is used.

The piezoelectric thin film 4 has a negative surface and a positive surface in the polarization axis direction. As shown in FIG. 1, the first principal surface 4a of the piezoelectric thin film 4 is the positive surface in the polarization axis direction and the second principal surface 4b is the negative surface in the polarization axis direction. The first principal surface 4a, which is the positive surface in the polarization axis direction, of the piezoelectric thin film 4 is stacked on the low acoustic velocity film 3. Consequently, as will be described later, a close contact property between the low acoustic velocity film 3 and the piezoelectric thin film 4 is able to be improved, and variations in the characteristics are able to be reduced.

Figure 2:
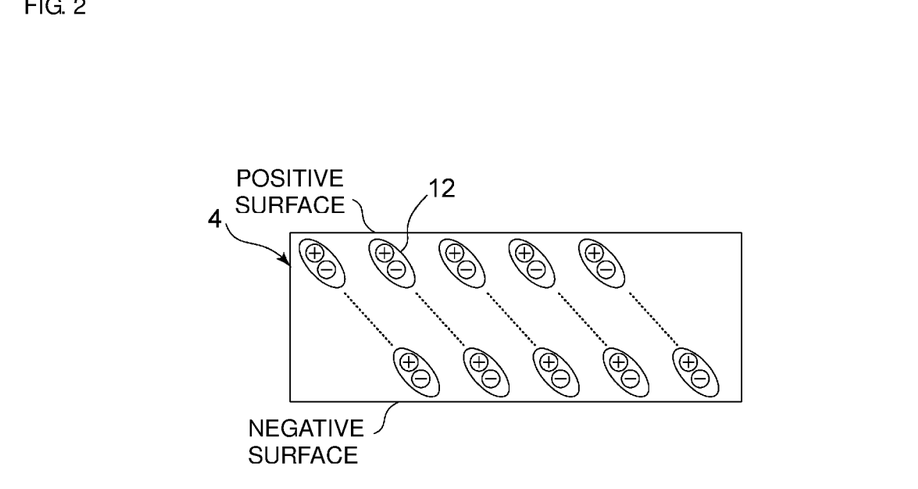
FIG. 2 is a schematic sectional view illustrating a positive surface and a negative surface in the polarization axis direction of a piezoelectric thin film.

In this regard, as shown in FIG. 2, a polarization component 12 in the piezoelectric thin film 4 extends in the polarization axis direction. As shown in FIG. 2, the negative surface in the polarization axis direction refers to a surface located in the negative side direction of the polarization component 12 in the piezoelectric thin film 4. The positive surface in the polarization axis direction refers to a surface located in the positive side direction of the polarization component 12 in the piezoelectric thin film 4.

The IDT electrode 5 is preferably made of an appropriate metal. Examples of such a metal include metals, e.g., Al, Cu, Pt, Au, Ag, Ti, Ni, Cr, Mo, and W, and alloys containing these metals as primary components. The IDT electrode 5 may be made of a multilayer metal film that is produced by stacking a plurality of metal films.

In the elastic wave device 1 according to the present preferred embodiment, an elastic wave resonator including the IDT electrode 5 is provided.

Next, it will be explained with reference to specific experimental examples that variations in the characteristics are able to be reduced to a great extent in accordance with the above-described preferred embodiment.

An elastic wave resonator was produced as an example of the elastic wave device 1 according to the above-described preferred embodiment. In addition, for the purpose of comparison, an elastic wave resonator was produced as a comparative example in the same or substantially the same manner as in the above-described example, except that the negative surface in the polarization axis direction of the piezoelectric thin film 4 was stacked on the low acoustic velocity film 3.

Figure 3:
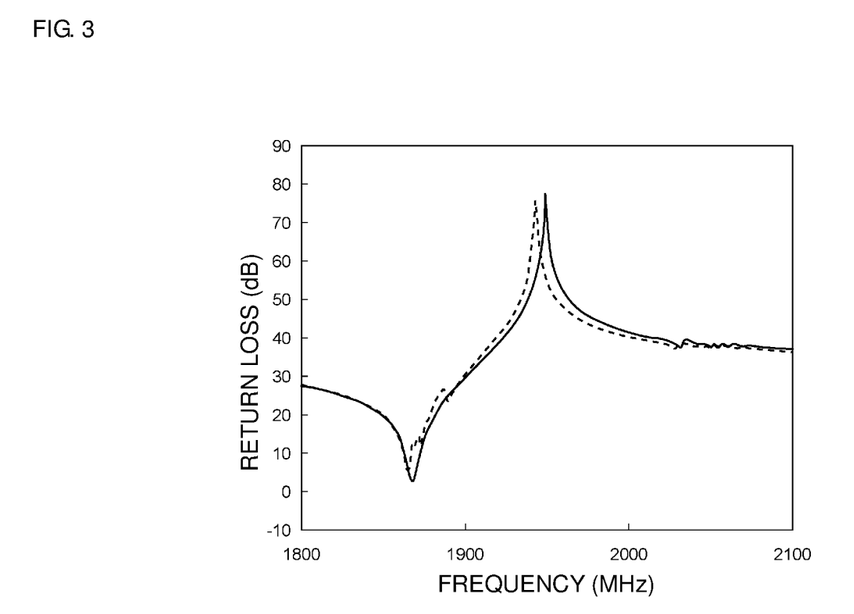
FIG. 3 is a diagram showing return loss characteristics of an elastic wave resonator according to the first preferred embodiment of the present invention.

The solid line in FIG. 3 indicates the return loss characteristics of the elastic wave resonator of the above-described example. The broken line indicates the return loss characteristics of the comparative example.

Figure 4:
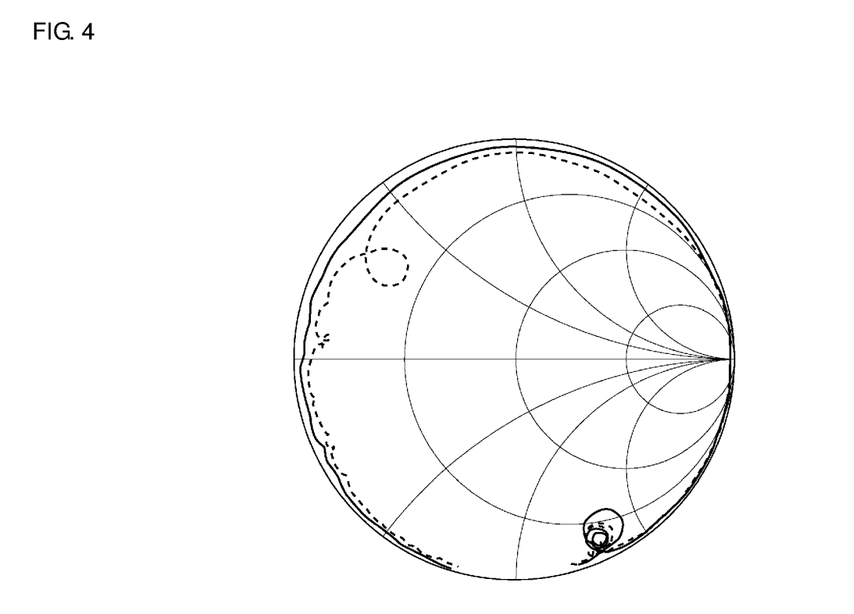
FIG. 4 is a diagram showing an impedance Smith chart for an elastic wave resonator according to the first preferred embodiment of the present invention.

Further, the solid line in FIG. 4 indicates the impedance Smith chart for the elastic wave resonator of the above-described example, and the broken line indicates the impedance Smith chart for the elastic wave resonator of the comparative example. As is clear from comparisons between the broken lines and the solid lines in FIG. 3 and FIG. 4, in the comparative example, the frequency range between the resonant frequency and the anti-resonant frequency, that is, the band width ratio, was relative small and a large ripple appeared in this frequency range.

Meanwhile, it is clear that a ripple in the range is able to be reduced to a great extent in accordance with the above-described example.

Figure 5:
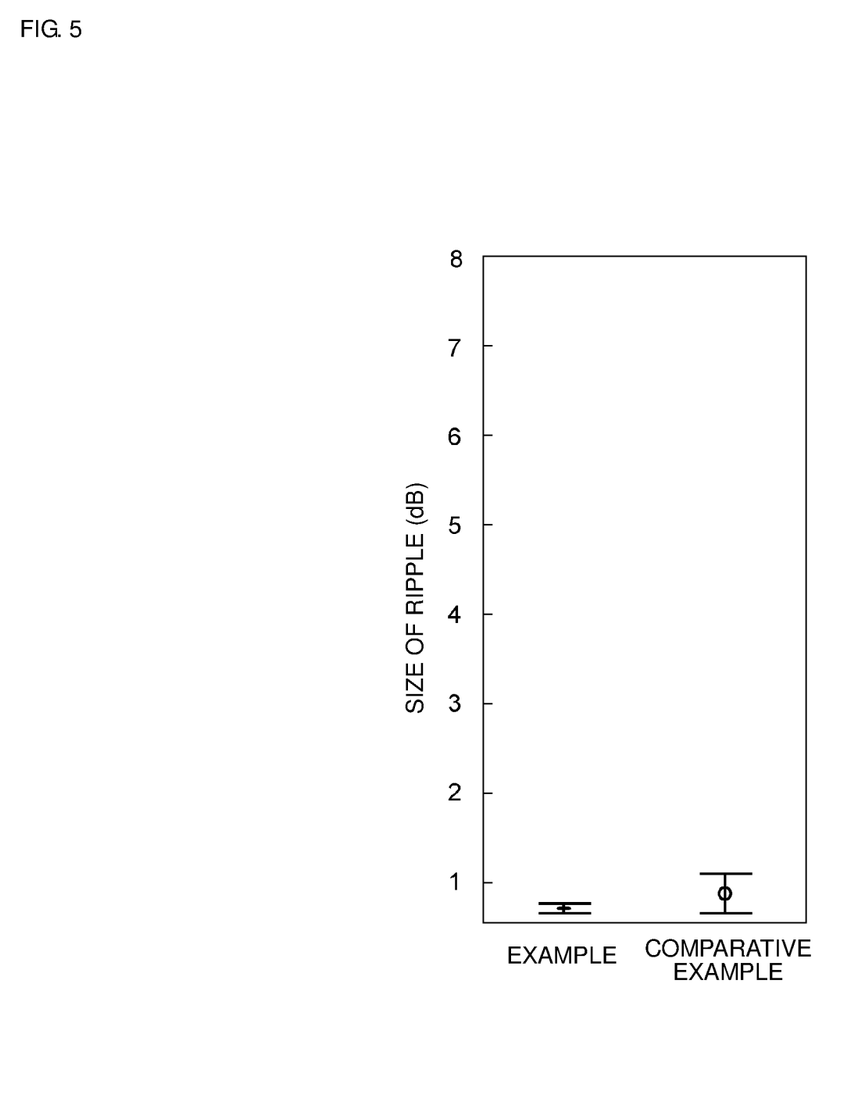
FIG. 5 is a diagram showing the sizes of in-band ripples when a negative surface in the polarization axis direction of a piezoelectric thin film stacked on a low acoustic velocity film and when a positive surface in the polarization axis direction is stacked on a low acoustic velocity film.

The size of the largest ripple in the above-described frequency range is assumed to be a maximum ripple. FIG. 5 shows the sizes of the maximum ripples in the above-described example and the comparative example.

As clearly shown in FIG. 5, the maximum ripple is able to be reduced to a great extent in accordance with the above-described example as compared to that in the comparative example.

As described above, the ripple in the above-described frequency range is able to be reduced to a great extent and variations in the characteristics are able to be reduced in accordance with the example as compared to those in the comparative example. The reason for this is considered to be that not only the IDT electrode 5 is disposed on the negative surface in the polarization axis direction of the piezoelectric thin film 4, but also the first principal surface 4a of the piezoelectric thin film 4, that is the positive surface in the polarization axis direction, is stacked on the low acoustic velocity film 3. It is considered that a chemical reaction easily occurs at the interface between the positive surface in the polarization axis direction of the piezoelectric thin film 4 and the film surface of the inorganic oxide, such as silicon oxide, and a chemical reaction does not easily occur at the interface between the negative surface in the polarization axis direction and the inorganic oxide film.

Figure 6:
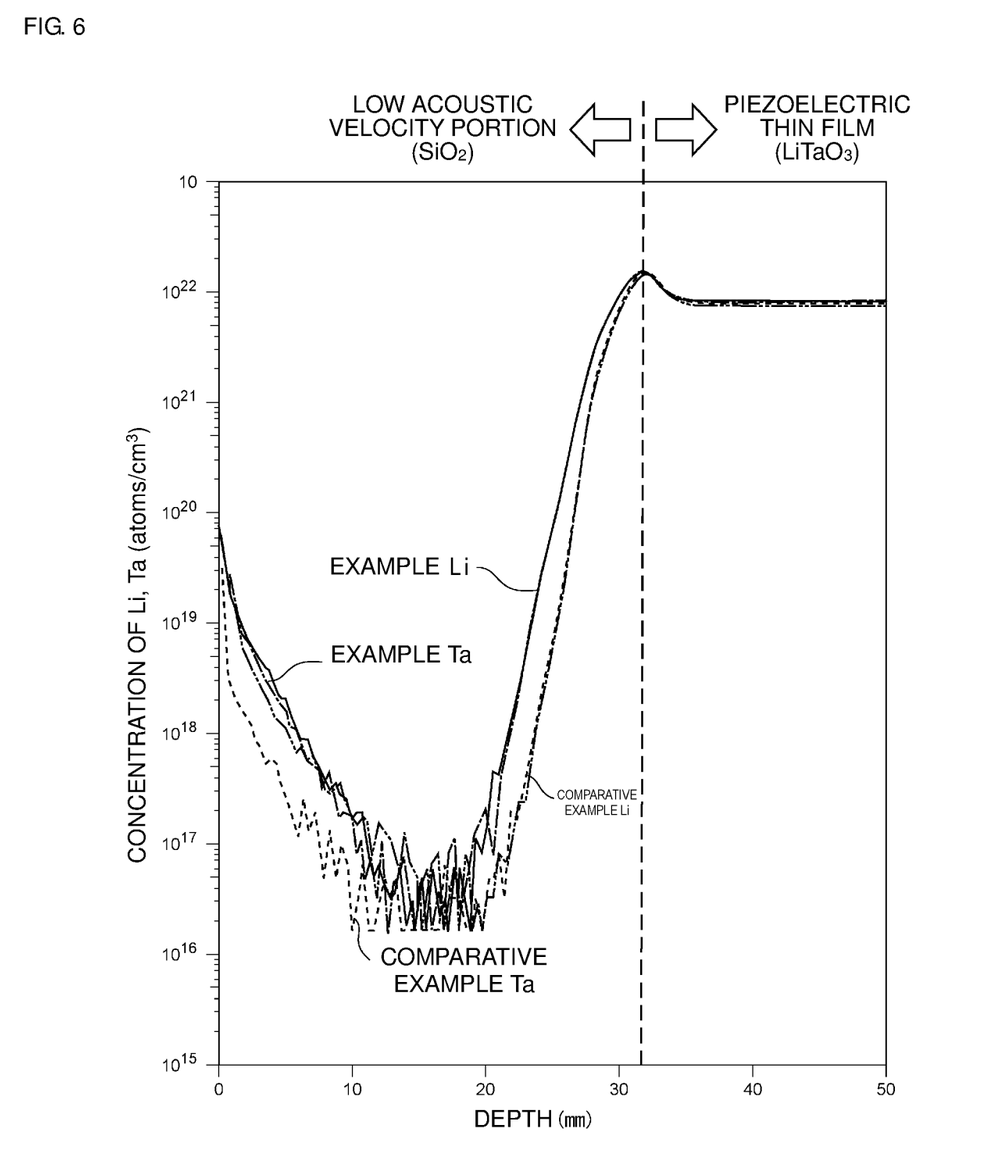
FIG. 6 is a diagram showing the relationship between the position in the depth direction of a low acoustic velocity film made of $SiO_2$ or in a piezoelectric thin film made of $LaTiO_3$ and the concentration of Li or Ta in an elastic wave device.

In addition, it was determined that the ripple in the above-described frequency range could be further reduced when the film formation temperature of $SiO_2$ is increased. FIG. 6 is a diagram showing the relationship between the position in the depth direction of a portion, in which a low acoustic velocity film made of $SiO_2$ and a piezoelectric thin film made of $LiTaO_3$ are stacked, and the concentration of Li or Ta. It is clear that the degree of diffusion of Li into the low acoustic velocity film in the example is larger than the degree of diffusion in the comparative example. It is considered that Li ions of $LiTaO_3$ diffuse into the low acoustic velocity film 3 made of an inorganic oxide and, thus, the degree of close contact between the two is also increased. Similarly, in the case of LiNbO$_3$, the degree of close contact is increased due to diffusion of Li ions.

As described above, it is considered that in the example, the degree of close contact between the low acoustic velocity film 3 and the piezoelectric thin film 4 is increased as compared to the degree of close contact in the comparative example and, thus, the ripple in the above-described frequency range is reduced and, in addition, variations therein are reduced.

In the elastic wave device 1, the support substrate 2, the low acoustic velocity film 3, and the piezoelectric thin film 4 are stacked and, therefore, the Q value is able to be increased. In particular, when the wavelength that is determined in accordance with the electrode finger pitch of the IDT electrode is assumed to be λ, the thickness of the piezoelectric thin film 4 is preferably within the range of about 3.5λ or less, for example. Consequently, not only the Q value is increased, but also variations in the characteristics due to variations in the piezoelectric thin film 4 are able to be reduced. This will be described with reference to FIG. 15 to FIG. 17.

Figure 15:
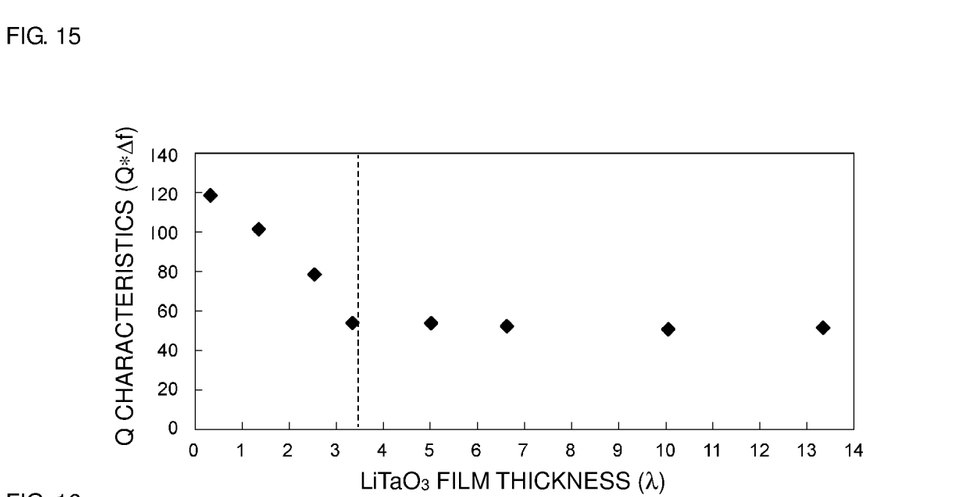
FIG. 15 is a diagram showing the relationship between the film thickness of a $LiTaO_3$ film and Q in an elastic wave device.
Figure 16:
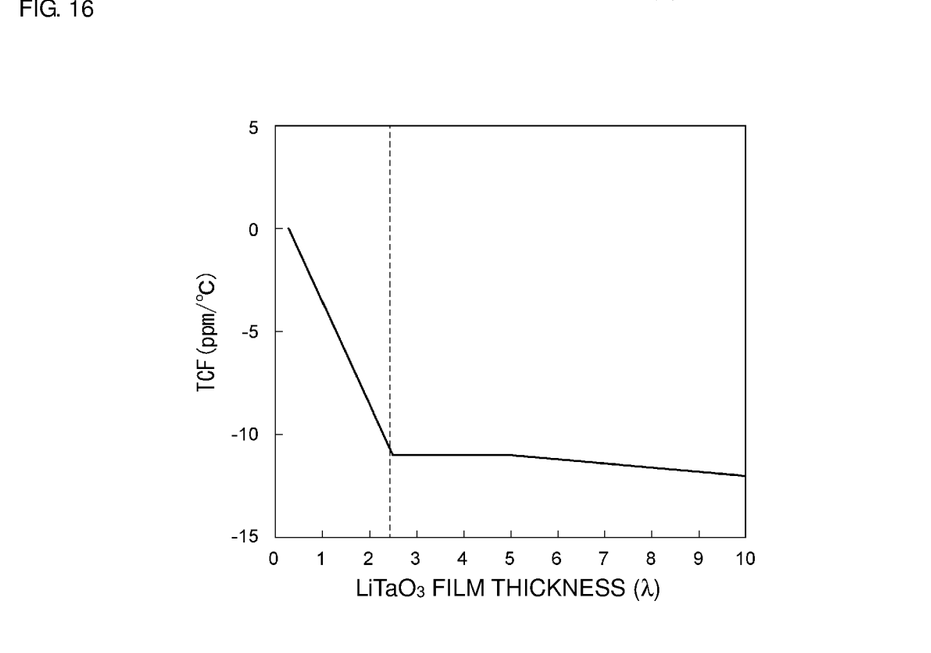
FIG. 16 is a diagram showing the relationship between the film thickness of a $LiTaO_3$ film and the temperature coefficient of resonant frequency TCF in an elastic wave device.
Figure 17:
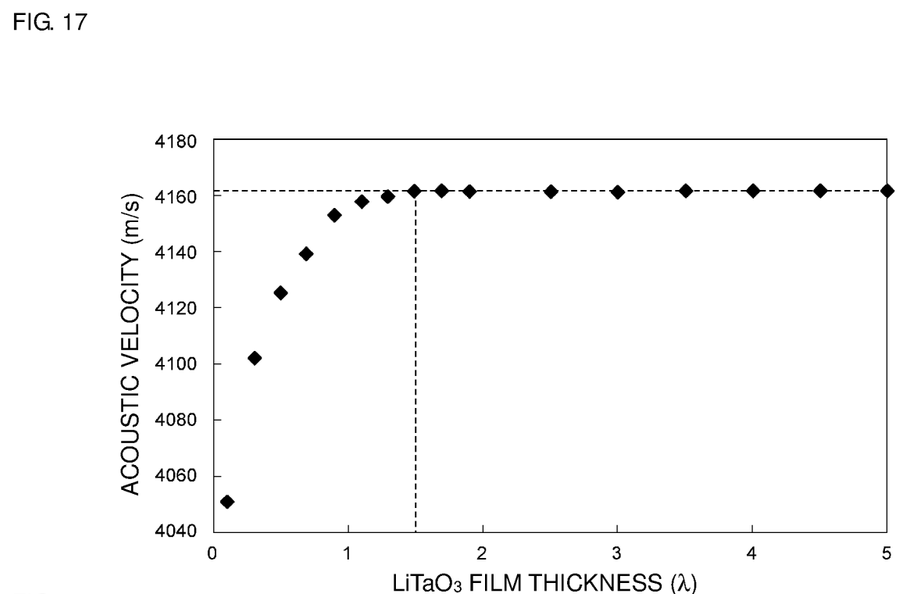
FIG. 17 is a diagram showing the relationship between the film thickness of a $LiTaO_3$ film and the acoustic velocity in an elastic wave device.

FIG. 15 is a diagram showing the relationship between the film thickness of LiTaO$_3$ and the Q value in an elastic wave device in which the low acoustic velocity film 3 made of a SiO$_2$ film having a thickness of about 3.5λ and the piezoelectric thin film 4 made of LiTaO$_3$ with Euler angle (0°, 140.0°, 0°) are stacked on the support substrate 2 made of silicon. Here, the vertical axis in FIG. 15 indicates the product of the Q characteristics of the resonator and the band width ratio (Δf), and the product is generally used as an indicator to determine the quality of the device characteristics. Meanwhile, FIG. 16 is a diagram showing the relationship between the film thickness of LiTaO$_3$ and the temperature coefficient of resonant frequency TCF. FIG. 17 is a diagram showing the relationship between the film thickness of LiTaO$_3$ and the acoustic velocity. As clearly shown in FIG. 15, when the film thickness of LiTaO$_3$ is about 3.5λ or less, the Q value increases and the Q characteristics are improved compared with when the film thickness is more than about 3.5λ. More preferably, in order to further increase the Q value, it is preferable that the film thickness of LiTaO$_3$ be about 2.5λ or less.

In addition, as shown in FIG. 16, when the film thickness of LiTaO$_3$ is about 2.5λ or less, the absolute value of the temperature coefficient of resonant frequency TCF is able to be reduced as compared to when the film thickness is more than about 2.5λ. It is preferable that the film thickness of LiTaO$_3$ be within the range of about 2.5λ or less because the absolute value of the temperature coefficient of resonant frequency TCF is able to be made more preferably about 10 ppm/° C. or less.

As clearly shown in FIG. 17, when the film thickness of LiTaO$_3$ is about 1.5λ or less, the acoustic velocity is able to be easily adjusted by controlling the film thickness. Therefore, it is further preferable that the film thickness of LiTaO$_3$ be about 1.5λ or less, for example.

Figure 18:
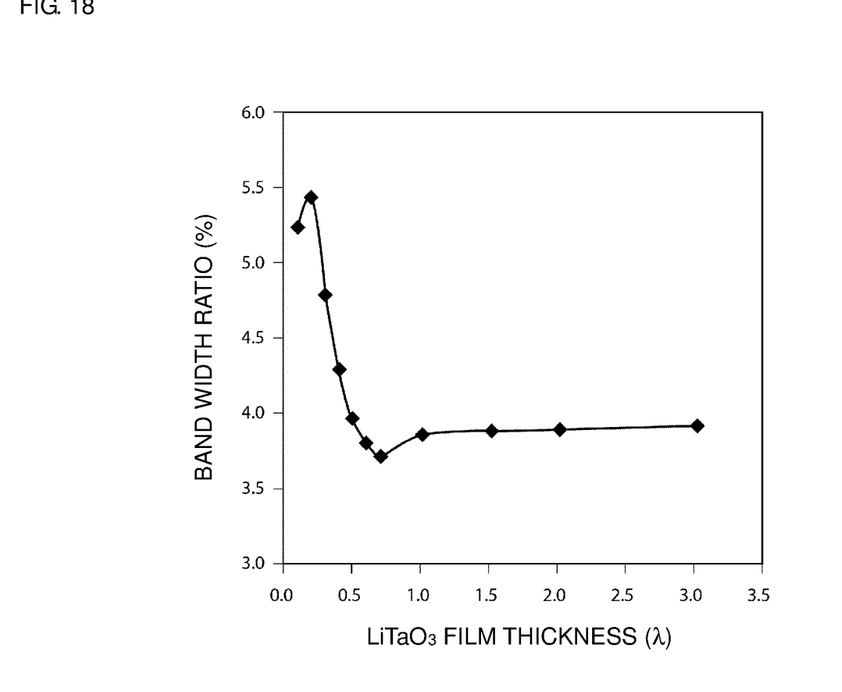
FIG. 18 is a diagram showing the relationship between the thickness of a piezoelectric thin film made of $LiTaO_3$ and the band width ratio.

Meanwhile, FIG. 18 is a diagram showing a change in the band width ratio when the thickness of a piezoelectric thin film made of LiTaO$_3$ is changed.

As clearly shown in FIG. 18, when the film thickness of LiTaO$_3$ is about 1.5λ or more, the band width ratio does not significantly change. This is because the energy of a surface acoustic wave is confined in the piezoelectric thin film and is not distributed into the low acoustic velocity film 3 and the high acoustic velocity support substrate. Therefore, it is considered that when the film thickness of the piezoelectric thin film is set to be about 1.5λ or less, the energy of a surface acoustic wave is able to be sufficiently distributed into the low acoustic velocity film 3 and the Q value is able to be further increased.

In the elastic wave device 1 according to the first preferred embodiment, the low acoustic velocity film 3, the piezoelectric thin film 4, and the IDT electrode 5 are stacked on the support substrate 2, however, the multilayer structure in the elastic wave devices according to the present invention is not limited thereto. Modified multilayer structures will be described with reference to second to ninth preferred embodiments shown in FIG. 7 to FIG. 14.

Figure 7:
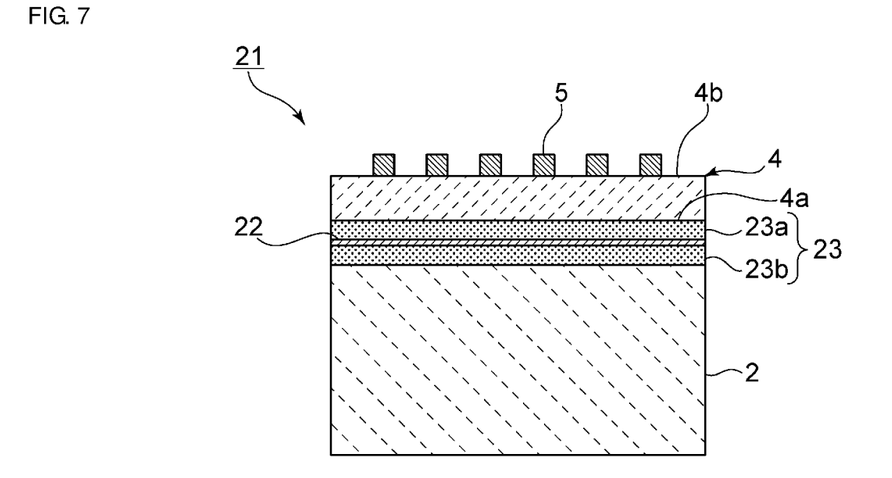
FIG. 7 is a sectional front view showing an elastic wave device according to a second preferred embodiment of the present invention.

In an elastic wave device 21 according to a second preferred embodiment of the present invention shown in FIG. 7, a low acoustic velocity film 23 is used in place of the low acoustic velocity film 3 in the first preferred embodiment. The low acoustic velocity film 23 includes a first low acoustic velocity layer 23a and a second low acoustic velocity layer 23b. The first low acoustic velocity layer 23a and the second low acoustic velocity layer 23b are bonded with a first adhesive layer 22 interposed therebetween.

The first low acoustic velocity layer 23a and the second low acoustic velocity layer 23b may be made of an appropriate material that defines the above-described low acoustic velocity film 3. Preferably, the material of the first low acoustic velocity layer 23a and the material of the second low acoustic velocity layer 23b are preferably selected to be the same.

In this regard, the material of the first low acoustic velocity layer 23a and the material of the second low acoustic velocity layer 23b are assumed to be the same when 50% or more of the primary components thereof are the same. It is more preferable that about 75% or more of the primary components be the same. It is further preferable that about 100% of the primary components be the same.

The first adhesive layer 22 is preferably made of an appropriate adhesive. Examples of such an adhesive include polyimide and epoxy resin adhesives.

In the elastic wave device 21, the piezoelectric thin film 4 is stacked on the low acoustic velocity film 23 such that a first principal surface 4a, which is a positive surface in the polarization axis direction of the piezoelectric thin film 4, comes into contact with the low acoustic velocity film 23. Therefore, the same or similar effects as in the first preferred embodiment are obtained.

In this regard, when production is performed, a first multilayer body, in which the second low acoustic velocity layer 23b is stacked on the support substrate 2, and a second multilayer body, in which the first low acoustic velocity layer 23a is stacked on the first principal surface 4a of the piezoelectric thin film and the IDT electrode 5 is disposed on the second principal surface 4b, may be bonded with the first adhesive layer 22 interposed therebetween.

Figure 8:
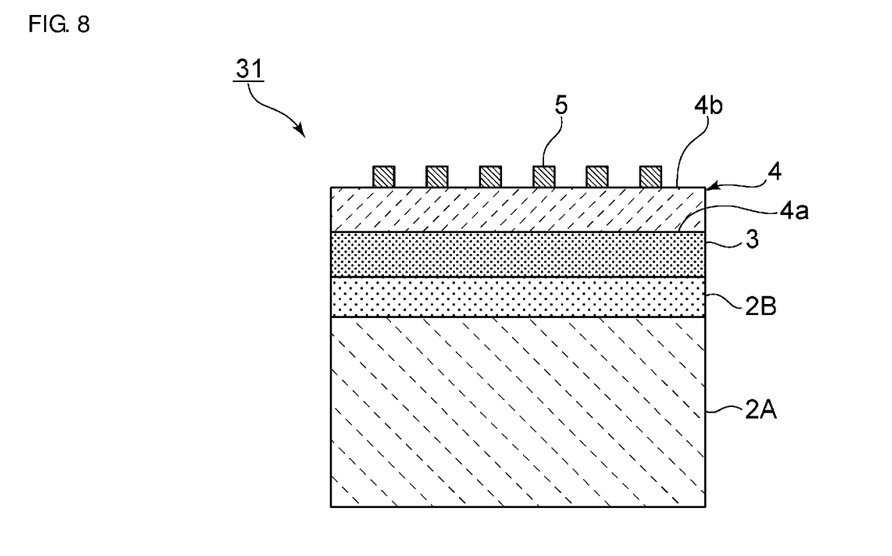
FIG. 8 is a sectional front view showing an elastic wave device according to a third preferred embodiment of the present invention.

In an elastic wave device 31 according to a third preferred embodiment of the present invention shown in FIG. 8, a high acoustic velocity film 2B defining a high acoustic velocity member is stacked on a support substrate 2A. The low acoustic velocity film 3 and the piezoelectric thin film 4 are stacked on the high acoustic velocity film 2B.

The same or similar material as the material of the support substrate 2 may be used as the material of the support substrate 2A. Regarding a material of the support substrate 2B, an appropriate material may be used as long as a bulk wave propagates through the high acoustic velocity film 2B at a velocity higher than the velocity of an elastic wave in the main mode that propagates through the piezoelectric thin film 4. Aluminum nitride, aluminum oxide, silicon carbide, silicon oxynitride, silicon nitride, DLC, diamond, and other material, which are disclosed as the material of the above-described high acoustic velocity support substrate, are suitable for use as such the material.

In the elastic wave device 31, the first principal surface 4a of the piezoelectric thin film 4 is stacked on the low acoustic velocity film 3 and, thus, the same or similar effects as in the first preferred embodiment are obtained. In the first preferred embodiment, an elastic wave is able to be effectively confined when the support substrate 2 is a high acoustic velocity support substrate, but in the elastic wave device 31, an elastic wave is able to be effectively confined in the piezoelectric thin film 4 rather than in the high acoustic velocity film 2B.

Figure 9:
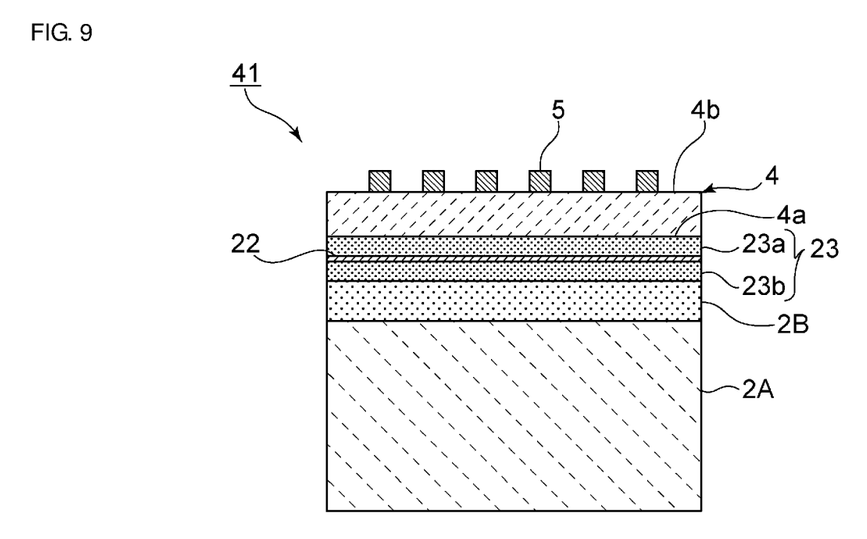
FIG. 9 is a sectional front view showing an elastic wave device according to a fourth preferred embodiment of the present invention.

An elastic wave device 41 according to a fourth preferred embodiment of the present invention shown in FIG. 9 corresponds to an elastic wave device having a structure in which the low acoustic velocity film 3 in the elastic wave device 31 is replaced with the low acoustic velocity film 23 and the first adhesive layer 22 in the elastic wave device 21. Therefore, in the elastic wave device 41, the degree of close contact between the low acoustic velocity film 23 and the piezoelectric thin film 4 is able to be increased and variations in the characteristics are able to be reduced in the same or similar manner as in the first to third preferred embodiments.

In this regard, when production is performed, a multilayer portion facing one surface of the first adhesive layer 22 and a multilayer portion facing the other surface may be bonded with the first adhesive layer interposed therebetween as in the elastic wave device 21.

Figure 10:
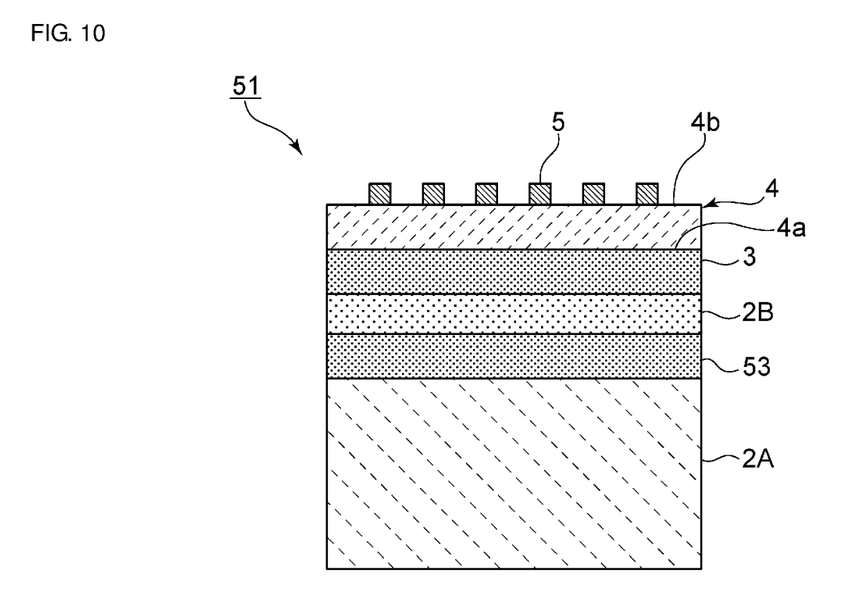
FIG. 10 is a sectional front view showing an elastic wave device according to a fifth preferred embodiment of the present invention.

An elastic wave device 51 according to a fifth preferred embodiment of the present invention shown in FIG. 10 is the same or substantially the same as the elastic wave device 31 shown in FIG. 8, except that a second low acoustic velocity film 53 is further included in the elastic wave device 31. The second low acoustic velocity film 53 is stacked between the support substrate 2A and the high acoustic velocity film 2B. In this manner, the second low acoustic velocity film 53 may be stacked on the surface opposite to the low acoustic velocity film 3 of the high acoustic velocity film 2B. The second low acoustic velocity film 53 may also be made of the same material as the material of the low acoustic velocity film 3. Preferably, the materials of the low acoustic velocity film 3 and the second low acoustic velocity film 53 are the same. In this regard, the material of the low acoustic velocity film 3 and the material of the second low acoustic velocity film 53 are assumed to be the same when 50% or more of the primary components thereof are the same. It is more preferable that about 75% or more of the primary components be the same. It is further preferable that about 100% of the primary components be the same.

In the present preferred embodiment, the piezoelectric thin film 4 is stacked on the low acoustic velocity film 3 such that the first principal surface 4a of the piezoelectric thin film 4 is stacked on the low acoustic velocity film 3 and, thus, the same or similar effects as the effects of the elastic wave devices in the first to fourth preferred embodiments are obtained.

Figure 11:
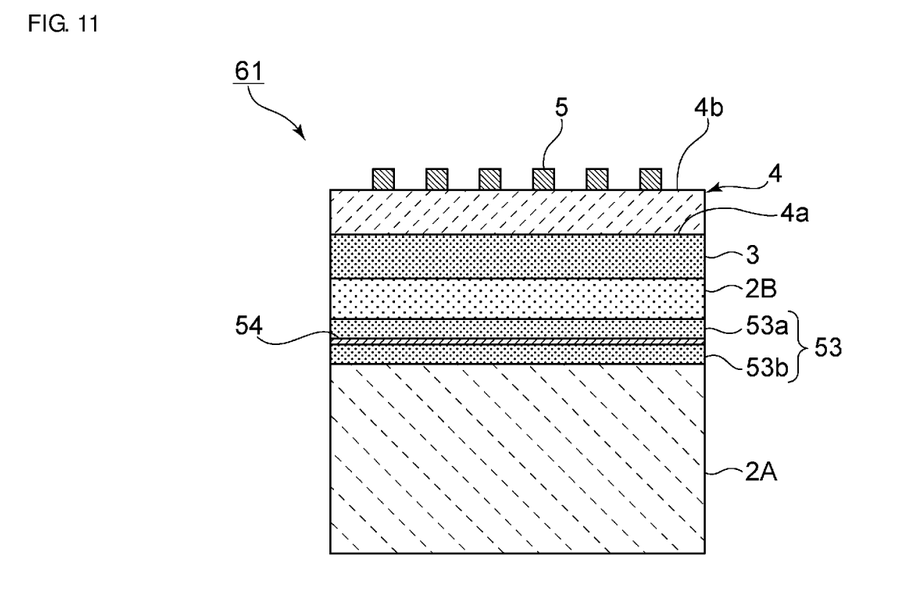
FIG. 11 is a sectional front view showing an elastic wave device according to a sixth preferred embodiment of the present invention.

In an elastic wave device 61 according to a sixth preferred embodiment of the present invention shown in FIG. 11, the second low acoustic velocity film 53 in the elastic wave device 51 includes a third low acoustic velocity layer 53a and a fourth low acoustic velocity layer 53b. The third low acoustic velocity layer 53a and the fourth low acoustic velocity layer 53b are bonded to each other with a second adhesive layer 54 interposed therebetween. The other configurations of the elastic wave device 61 are the same as those of the elastic wave device 51. Therefore, the elastic wave device 61 has the same or similar operations and advantages as those of the elastic wave device 51.

When production is performed, a multilayer portion facing one surface of the second adhesive layer 54 and a multilayer portion facing the other surface may be bonded with the second adhesive layer 54 interposed therebetween. An appropriate adhesive, e.g., polyimide and epoxy resins, may preferably be used for the second adhesive layer 54 in the same or similar manner as in the first adhesive layer 22.

Figure 12:
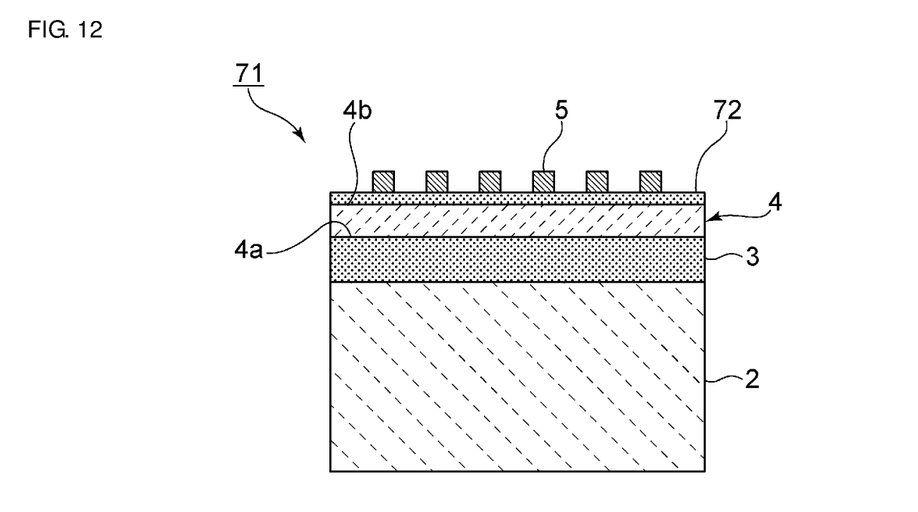
FIG. 12 is a sectional front view showing an elastic wave device according to a seventh preferred embodiment of the present invention.

In an elastic wave device 71 according to a seventh preferred embodiment of the present invention shown in FIG. 12, a third low acoustic velocity film 72 is stacked on the piezoelectric thin film 4, and the IDT electrode 5 is disposed on the third low acoustic velocity film 72. In this manner, the IDT electrode 5 may be indirectly disposed on the piezoelectric thin film 4. Regarding a material of the third low acoustic velocity film 72, the same material as the material of the low acoustic velocity film 3 may preferably be used. As described above, the IDT electrode 5 may be indirectly stacked on the second principal surface 4b that is the negative surface in the polarization axis direction of the piezoelectric thin film 4 with the third low acoustic velocity film 72 interposed therebetween.

The other configurations of the elastic wave device 71 are the same or substantially the same as those in the first preferred embodiment. Therefore, the elastic wave device 71 has the same or similar operations and advantages as those in the first preferred embodiment. The absolute value of the temperature coefficient of resonant frequency TCF is able to be more effectively reduced by disposing the third low acoustic velocity film 72.

Figure 13:
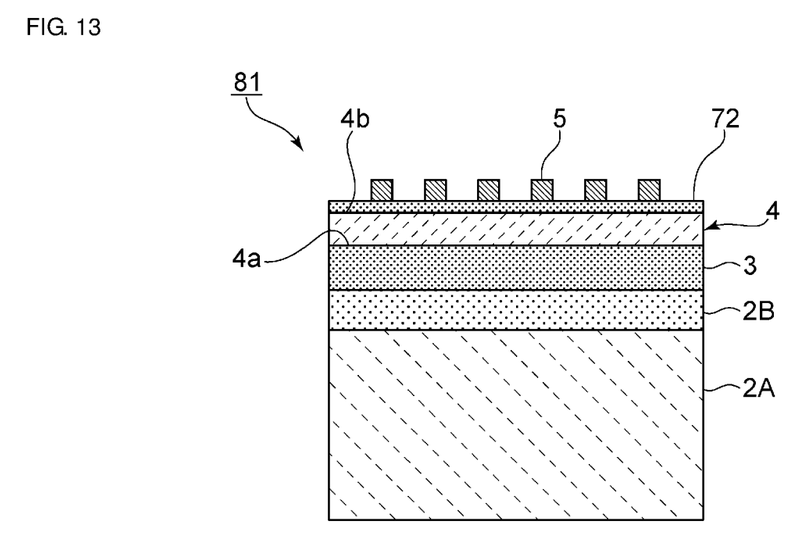
FIG. 13 is a sectional front view showing an elastic wave device according to an eighth preferred embodiment of the present invention.

An elastic wave device 81 according to an eighth preferred embodiment of the present invention shown in FIG. 13 corresponds to a structure in which the elastic wave device 31 according to the third preferred embodiment shown in FIG. 8 is provided with the third low acoustic velocity film 72. Therefore, the same or similar operations and advantages as those of the elastic wave device 31 according to the third preferred embodiment are obtained. In addition, the absolute value of the temperature coefficient of resonant frequency TCF is able to be further reduced because the third low acoustic velocity film 72 is provided.

Figure 14:
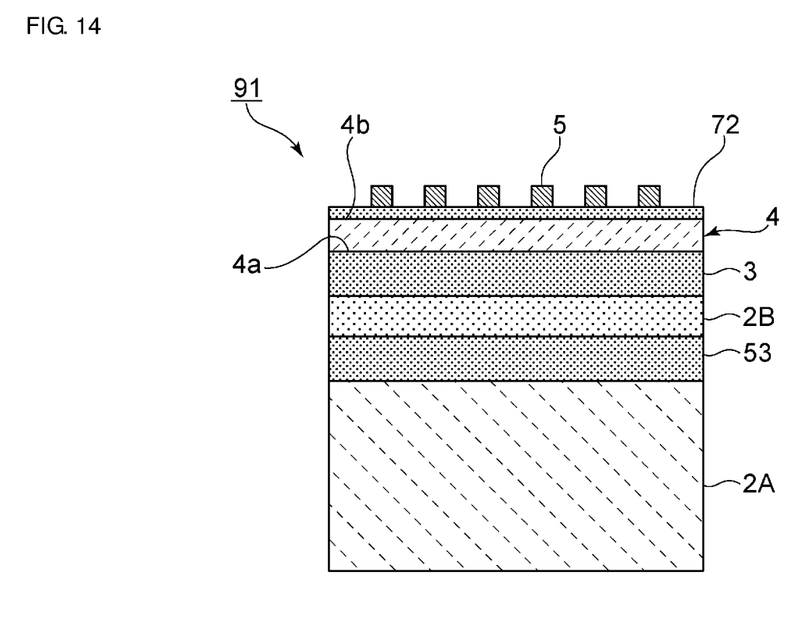
FIG. 14 is a sectional front view showing an elastic wave device according to a ninth preferred embodiment of the present invention.

An elastic wave device 91 according to a ninth preferred embodiment of the present invention shown in FIG. 14 corresponds to a structure in which the third low acoustic velocity film 72 is added to the elastic wave device 51 according to the fifth preferred embodiment shown in FIG. 10. Therefore, the elastic wave device 91 provides the same or similar operations and advantages as those of the elastic wave device 51. In addition, the absolute value of the temperature coefficient of resonant frequency TCF is able to be effectively reduced by the presence of the third low acoustic velocity film 72. The elastic wave devices 71, 81, and 91 according to the seventh to ninth preferred embodiments may also include the above-described first adhesive layer and second adhesive layer.

In the above-described preferred embodiments of the present invention, elastic wave resonators have been described. However, the elastic wave devices according to preferred embodiments of the present invention may be widely applied to not only elastic wave resonators but also various other elastic wave devices, e.g., a longitudinally coupled resonator-type elastic wave filter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a piezoelectric thin film;
a high acoustic velocity member, through which a bulk wave propagates at an acoustic velocity higher than an acoustic velocity of an elastic wave in a main mode that propagates through the piezoelectric thin film;
a low acoustic velocity film which is stacked on the high acoustic velocity member and through which a bulk wave propagates at an acoustic velocity lower than the acoustic velocity of an elastic wave in the main mode that propagates through the piezoelectric thin film; wherein
the piezoelectric thin film is disposed on the low acoustic velocity film;
an IDT electrode is disposed on the piezoelectric thin film; and
the piezoelectric thin film is made of a piezoelectric single crystal such that a first principal surface facing the low acoustic velocity film is a positive surface in a polarization axis direction, and a second principal surface facing the IDT electrode is a negative surface in the polarization axis direction.

2. The elastic wave device according to claim 1, wherein when a wavelength that is determined in accordance with an electrode finger pitch of the IDT electrode is denoted as λ, a thickness of the piezoelectric thin film is about 3.5λ or less.

3. The elastic wave device according to claim 2, wherein the thickness of the piezoelectric thin film is about 2.5λ or less.

4. The elastic wave device according to claim 3, wherein the thickness of the piezoelectric thin film is about 1.5λ or less.

5. The elastic wave device according to claim 1, wherein the low acoustic velocity film is made of an oxide other than the piezoelectric single crystal.

6. The elastic wave device according to claim 5, wherein the oxide is an inorganic oxide.

7. The elastic wave device according to claim 6, wherein the inorganic oxide is a material selected from a group consisting of silicon oxide, silicon oxynitride, tantalum oxide, and a compound produced by adding fluorine, carbon, or boron to silicon oxide.

8. The elastic wave device according to claim 1, wherein the piezoelectric single crystal is $LiNbO_3$ or $LiTaO_3$, and the low acoustic velocity film contains Li.

9. The elastic wave device according to claim 1, wherein the high acoustic velocity member includes a high acoustic velocity support substrate.

10. The elastic wave device according to claim 1, further comprising:
a support substrate; wherein
the high acoustic velocity member includes a high acoustic velocity film; and
the high acoustic velocity film is stacked between the support substrate and the low acoustic velocity film.

11. The elastic wave device according to claim 10, wherein
the low acoustic velocity film includes a first low acoustic velocity layer and a second low acoustic velocity layer; and
the first low acoustic velocity layer and the second low acoustic velocity layer are bonded to each other with a first adhesive layer interposed therebetween.

12. The elastic wave device according to claim 1, wherein
the low acoustic velocity film includes a first low acoustic velocity layer and a second low acoustic velocity layer; and
the first low acoustic velocity layer and the second low acoustic velocity layer are bonded to each other with a first adhesive layer interposed therebetween.

13. The elastic wave device according to claim 10, further comprising a second low acoustic velocity film stacked between the high acoustic velocity film and the support substrate.

14. The elastic wave device according to claim 13, wherein
the second low acoustic velocity film includes a third low acoustic velocity layer and a fourth low acoustic velocity layer; and
the third low acoustic velocity layer and the fourth low acoustic velocity layer are bonded to each other with a second adhesive layer interposed therebetween.

15. The elastic wave device according to claim 12, wherein a third low acoustic velocity film is disposed on a second principal surface of the piezoelectric thin film, and the IDT electrode is disposed on the second low acoustic velocity film.

16. The elastic wave device according to claim 11, wherein a third low acoustic velocity film is disposed on a second principal surface of the piezoelectric thin film, and the IDT electrode is disposed on the second low acoustic velocity film.

17. The elastic wave device according to claim 1, wherein a third low acoustic velocity film is disposed on a second principal surface of the piezoelectric thin film, and the IDT electrode is disposed on the second low acoustic velocity film.

18. The elastic wave device according to claim 1, wherein a primary component of the IDT electrode is at least one of Al, Cu, Pt, Au, Ag, Ti, Ni, Cr, Mo, and W, and an alloy thereof.

* * * * *